(12) United States Patent
Zhang et al.

(10) Patent No.: US 12,127,397 B2
(45) Date of Patent: Oct. 22, 2024

(54) MEMORY DEVICE AND METHOD FOR FORMING THE SAME

(71) Applicant: CHANGXIN MEMORY TECHNOLOGIES, INC., Hefei (CN)

(72) Inventors: Lingguo Zhang, Hefei (CN); Thomas Jongwan Kwon, Hefei (CN); Lintao Zhang, Hefei (CN); Xiangui Zhou, Hefei (CN); Xu Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 373 days.

(21) Appl. No.: 17/602,832

(22) PCT Filed: Jul. 2, 2021

(86) PCT No.: PCT/CN2021/104376
§ 371 (c)(1),
(2) Date: Oct. 11, 2021

(87) PCT Pub. No.: WO2022/028175
PCT Pub. Date: Feb. 10, 2022

(65) Prior Publication Data
US 2023/0062348 A1 Mar. 2, 2023

(30) Foreign Application Priority Data
Aug. 5, 2020 (CN) .......................... 202010778887.2

(51) Int. Cl.
*H10B 12/00* (2023.01)
(52) U.S. Cl.
CPC ................................. *H10B 12/482* (2023.02)

(58) Field of Classification Search
CPC .. H10B 12/482; H10B 12/485; H10B 12/315; H10B 12/01; H10B 12/00; H01L 21/76883; H01L 21/76885; G11C 7/18
See application file for complete search history.

(56) References Cited

U.S. PATENT DOCUMENTS

2018/0211964 A1* 7/2018 Feng .................... H10B 12/482
2021/0398984 A1* 12/2021 Zhang ............... H01L 29/66477

FOREIGN PATENT DOCUMENTS

CN 108172620 A 6/2018
CN 110556359 A 12/2019
(Continued)

OTHER PUBLICATIONS

International Search Report cited in PCT/CN2021/104376 mailed Sep. 28, 2021, 9 pages.

*Primary Examiner* — Shouxiang Hu
(74) *Attorney, Agent, or Firm* — Syncoda LLC; Feng Ma (57) ABSTRACT

The present disclosure provides a forming method of a memory and a memory. The method includes: providing a substrate, wherein the substrate includes at least word line structures and active areas, and a bottom dielectric layer and a bit line contact layer located on a top surface of the substrate, the bottom dielectric layer has bit line contact openings, the bit line contact openings expose the active areas in the substrate, and the bit line contact layer covers the bottom dielectric layer and fills the bit line contact openings; etching parts of the bit line contact layer, and forming first bit line contact layer with different heights; forming a conductive layer, a top surface of the conductive layer is located at different heights in a direction perpendicular to an extension direction of the word line structures.

10 Claims, 7 Drawing Sheets

(56) References Cited

FOREIGN PATENT DOCUMENTS

KR     20080092557 A     10/2008
KR     20090111050 A     10/2009

\* cited by examiner

MEMORY DEVICE AND METHOD FOR FORMING THE SAME

CROSS-REFERENCE TO RELATED APPLICATIONS

The present disclosure is a national stage entry of International Application No. PCT/CN2021/104376, filed on Jul. 2, 2021, which claims the priority to Chinese Patent Application 202010778887.2, titled "FORMING METHOD OF MEMORY AND MEMORY", filed with China National Intellectual Property Administration (CNIPA) on Aug. 5, 2020. The entire contents of International Application No. PCT/CN2021/104376 and Chinese Patent Application 202010778887.2 are incorporated herein by reference.

TECHNICAL FIELD

The present disclosure relates to, but is not limited to, a forming method of a memory and a memory.

BACKGROUND

As a feature size and a line width of a dynamic random access memory (DRAM) continue to decrease, a spacing between adjacent bit line structures has also become smaller. As the spacing between the adjacent bit line structures becomes smaller, a parasitic capacitance between the adjacent bit line structures continuously increase, affecting a saturation current of an array region of the DRAM, and further affecting operating efficiency of the DRAM.

With the continuous decrease in the line width of the DRAM, how to increase the spacing between the bit line structures is currently an urgent problem to be resolved.

SUMMARY

An overview of the subject matter detailed in the present disclosure is provided below, which is not intended to limit the protection scope of the claims.

The present disclosure provides a forming method of a memory and a memory.

A first aspect of the present disclosure provides a method of forming a memory, including: providing a substrate, wherein the substrate includes at least word line structures and active areas, and a bottom dielectric layer and a bit line contact layer located on a top surface of the substrate, the bottom dielectric layer has bit line contact openings, the bit line contact openings expose the active areas in the substrate, and the bit line contact layer covers the bottom dielectric layer and fills the bit line contact openings;
  etching parts of the bit line contact layer, and forming first bit line contact layer with different heights;
  forming a conductive layer on a top surface of the first bit line contact layer, a top surface of the conductive layer is located at different heights in a direction perpendicular to an extension direction of the word line structures;
  the top surface of the conductive layer is located at different heights in the extension direction of the word line structures;
  forming a top dielectric layer on the top surface of the conductive layer; and
  etching parts of the top dielectric layer, the conductive layer, and the first bit line contact layer in sequence, and forming discrete bit line structures.

A second aspect of the present disclosure provides a memory, including:
  a substrate, the substrate includes at least word line structures and active areas;
  a bottom dielectric layer, the bottom dielectric layer is located on a top of the substrate, the bottom dielectric layer has bit line contact openings, and the bit line contact openings expose the active areas in the substrate; and
  discrete bit line structures, top surfaces of the bit line structures are located at a same height, and each of the bit line structures includes: a first bit line contact layer located on a top of the bottom dielectric layer and in the bit line contact openings, a conductive layer located on a top of the first bit line contact layer, and a top dielectric layer located on a top of the conductive layer; the conductive layer in a same bit line structure is located at different heights in an extension direction of the bit line structures, and the conductive layer in adjacent bit line structures is located at different heights in an extension direction of the word line structures.

Other aspects of the present disclosure are understandable upon reading and understanding of the drawings and detailed description.

BRIEF DESCRIPTION OF THE DRAWINGS

The drawings incorporated into the specification and constituting a part of the specification illustrate the embodiments of the present disclosure, and are used together with the description to explain the principles of the embodiments of the present disclosure. In these drawings, similar reference numerals are configured to represent similar elements. The drawings in the following description are a part rather than all of the embodiments of the present disclosure. Those of ordinary skill in the art may obtain other drawings based on these drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

At present, as a feature size and a line width of a DRAM continue to decrease, a spacing between adjacent bit line structures has also become smaller. As the spacing between the adjacent bit line structures becomes smaller, a parasitic capacitance between the adjacent bit line structures continuously increase, affecting a saturation current of an array region of the DRAM, and further affecting operating efficiency of the DRAM.

An embodiment of the present disclosure provides a method of forming a memory, including: providing a substrate, the substrate includes at least a word line structure and an active area, and a bottom dielectric layer and a bit line contact layer located on a top surface of the substrate, the bit line contact layer covers the bottom dielectric layer; forming a photoresist layer on a top surface of the bit line contact layer; providing a mask structure, the mask structure includes a first mask pattern and a second mask pattern, the first mask pattern includes a plurality of first overlay patterns arranged in rows and columns, the second mask pattern includes a plurality of second overlay patterns arranged in rows and columns, the first overlay pattern rows and the second overlay pattern rows are alternately arranged in sequence, and the first overlay pattern columns and the second overlay pattern columns are alternately arranged in sequence; along a first direction, the mask structure includes a plurality of mask pattern groups, the mask pattern group includes a first mask pattern subgroup and a second mask pattern subgroup, the first mask pattern subgroup and the second mask pattern subgroup share at least one overlay pattern, the first mask pattern subgroup includes a first exposure pattern, the second mask pattern subgroup includes a second exposure pattern, the first exposure pattern and the second exposure pattern have different areas, and the first direction is parallel to the substrate; etching the first exposure pattern and the second exposure pattern to form bit line contact layers at different heights and bottom dielectric layers at different heights; forming a conductive layer on the top surface of the bit line contact layer, top surfaces of the conductive layers are located at different heights in a direction perpendicular to an extension direction of the word line structures, and the top surfaces of the conductive layers are located at different heights in the extension direction of the word line structures; forming a top dielectric layer on the top surface of the conductive layer; and etching parts of the top dielectric layer, the conductive layer, and the bit line contact layer in sequence to form discrete bit line structures. The first exposure pattern and the second exposure pattern in the mask structure have different areas, and an etching rate is related to an opening area. Therefore, after the first exposure pattern and the second exposure pattern are etched to form bit line contact layers at different heights, subsequently deposited conductive layers are also at different heights. In this way, without changing the arrangement of the bit line structures, a spacing between the conductive layers in the bit line structure can be increased and a parasitic capacitance between the conductive layers can be reduced.

The following clearly and completely describes the technical solutions in the embodiments of the present disclosure with reference to the accompanying drawings in the embodiments of the present disclosure. All other embodiments obtained by those of ordinary skill in the art based on the embodiments of the present disclosure without creative efforts should fall within the protection scope of the present disclosure.

FIG. 1 to FIG. 14 are each a schematic structural diagram corresponding to steps in a method of forming a memory according to an embodiment of the present disclosure. The following describes in detail the method of forming a memory in this embodiment.

Referring to FIG. 1 to FIG. 5, a substrate 100 is provided, the substrate 100 includes at least a word line structure 102 and an active area 101, and a bottom dielectric layer 110 and a bit line contact layer 120 located on a top surface of the substrate 100, the bottom dielectric layer 110 has a bit line contact opening 111, the bit line contact opening 111 exposes the active area 101 in the substrate 100, and the bit line contact layer 120 covers the bottom dielectric layer 110 and fills the bit line contact opening 111.

FIG. 1 to FIG. 5 are described in detail below with reference to the drawings.

Figure 1:
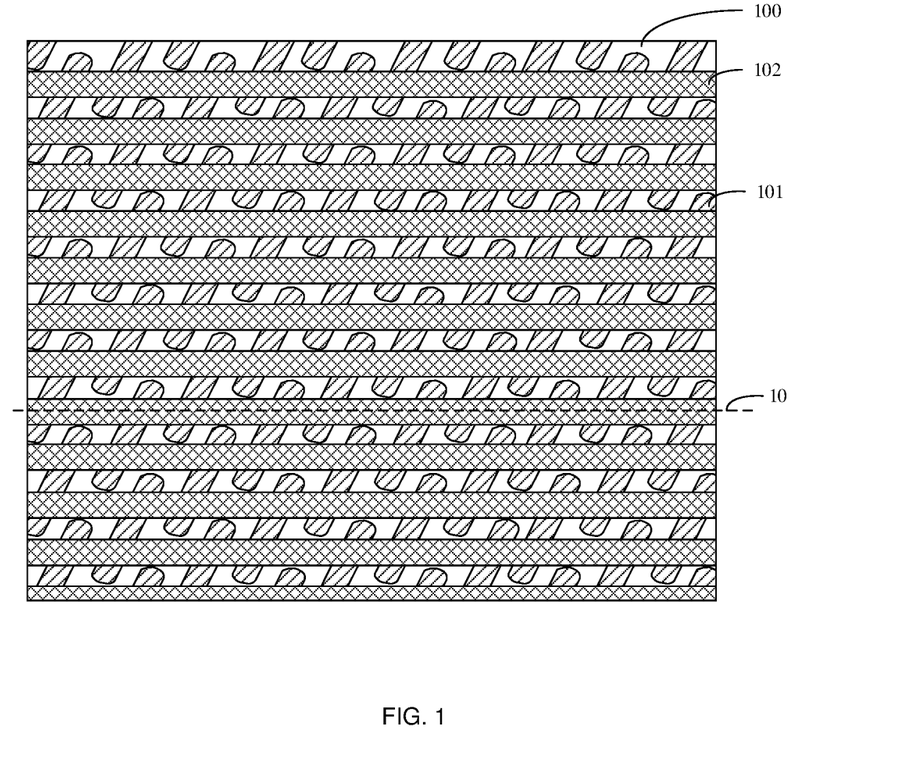
FIG. 1 to FIG. 14 are each a schematic structural diagram corresponding to steps in a method of forming a memory according to an embodiment of the present disclosure.

Referring to FIG. 1, the substrate 100 is provided, and the substrate 100 includes at least the word line structure 102 and the active area 101.

FIG. 1 shows an extension direction 10 of the word line structures, that is, a dotted line 10 in the figure.

A plurality of active areas 101 are arranged at intervals in parallel with each other. An active area 101 in an $i^{th}$ column and an active area 101 in an $(i+3)^{th}$ column are in a direction perpendicular to the extension direction 10 of the word line structures. Different active areas 101 are located at a same horizontal location. The active area 101 in the $i^{th}$ column and active areas 101 in adjacent columns (an $(i+1)^{th}$ column and an $(i-1)^{th}$ column) are located at different horizontal locations in the direction perpendicular to the extension direction 10 of the word line structures. A middle part of each of active areas 101 separated by alternately arranged word line structures 102 is a bit line contact point, for connecting subsequently formed bit line structures 200.

It should be noted that, the substrate 100 further includes another memory structure in addition to the word line structure 102 and the active area 101, for example, a shallow trench isolation structure. Those skilled in the art can understand that the substrate 100 further includes another memory structure in addition to the word line structure 102 and the active area 101, for normal operation of the memory.

A material of the substrate 100 may include sapphire, silicon, silicon carbide, gallium arsenide, aluminum nitride, zinc oxide, or the like. In this embodiment, the substrate 100 is formed by using a silicon material. Those skilled in the art are clear that use of the silicon material as the substrate 100 in this embodiment is to facilitate understanding of a subsequent forming method by those skilled in the art and does not constitute a limitation, and during actual application, a suitable material may be selected for the substrate 100 according to a requirement.

Referring to FIG. 2 to FIG. 5, the bottom dielectric layer 110 and the bit line contact layer 120 are formed on the top surface of the substrate 100, and the bit line contact layer 120 covers the bottom dielectric layer 110. The bottom dielectric layer 110 is configured to isolate bit line structures 200 in adjacent active areas 101. In this embodiment, a material of the bottom dielectric layer 110 is silicon nitride. In other embodiments, alternatively, the material of the bottom dielectric layer 110 may be an insulation material such as silicon oxide or silicon oxynitride.

Figure 2:
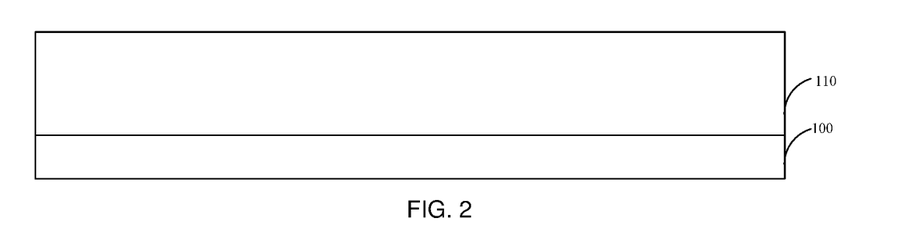
Figure 3:
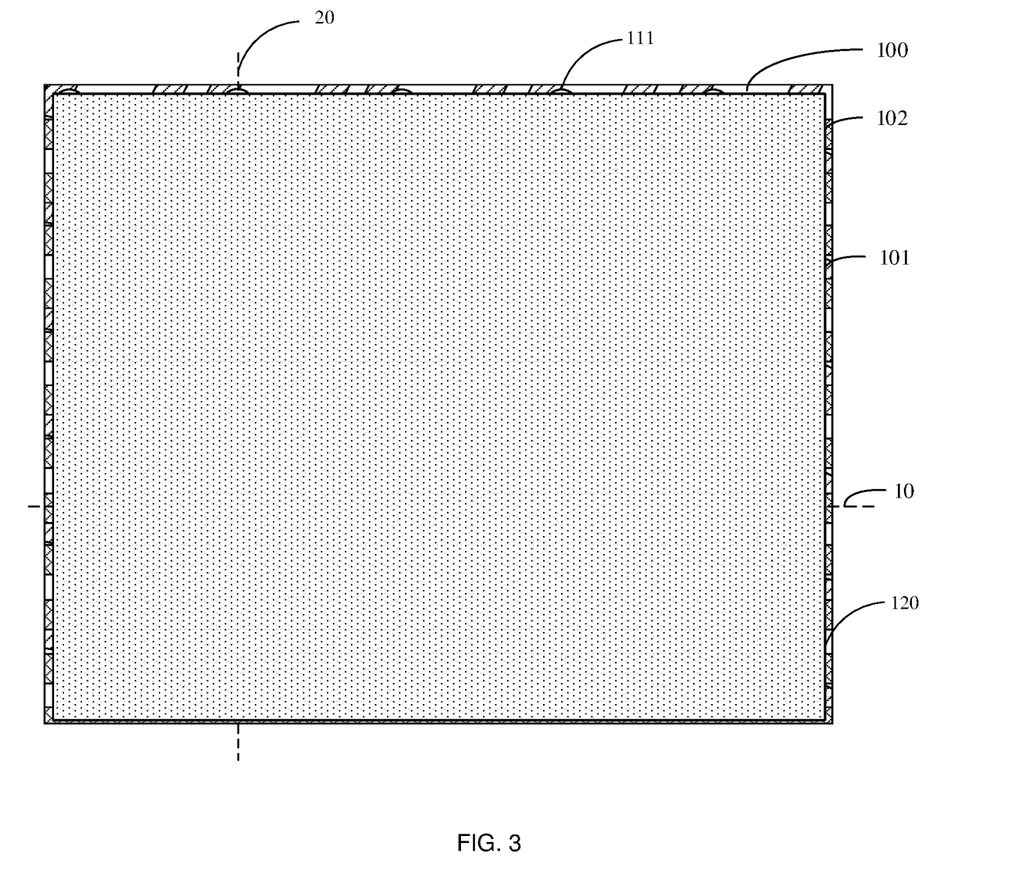

Referring to FIG. 3, FIG. 3 is a schematic top view of the substrate 100. Based on the formation of the bottom dielectric layer 110 in FIG. 2, FIG. 3 shows a location at which the bit line structure 200 subsequently needs to be formed. FIG. 3 shows an extension direction 20 of the bit line structure, that is, a dotted line 20 in the figure. The bit line structure 200 connects to a column of bit line contact points of the active areas 101.

Figure 4:
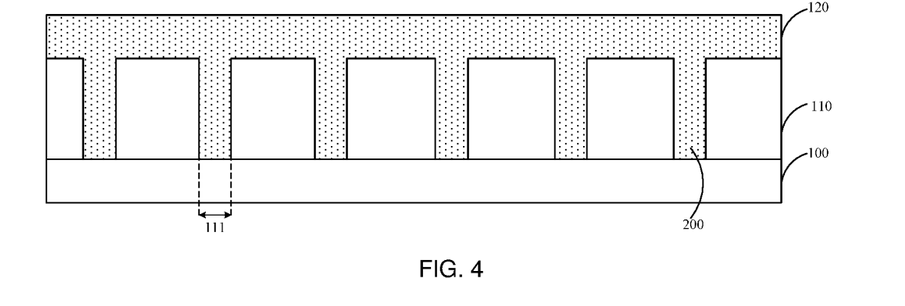

Referring to FIG. 4, the bit line contact layer 120 is formed on the top surface of the substrate 100, and the bit line contact layer 120 covers the bottom dielectric layer 110. FIG. 4 shows a location at which the bit line structure 200 subsequently needs to be formed.

In some embodiments of the present disclosure, the bit line contact layer 120 is made of a polycrystalline silicon material, for connecting the active areas 101 in the substrate 100 by the subsequently formed bit line structure 200.

Figure 5:
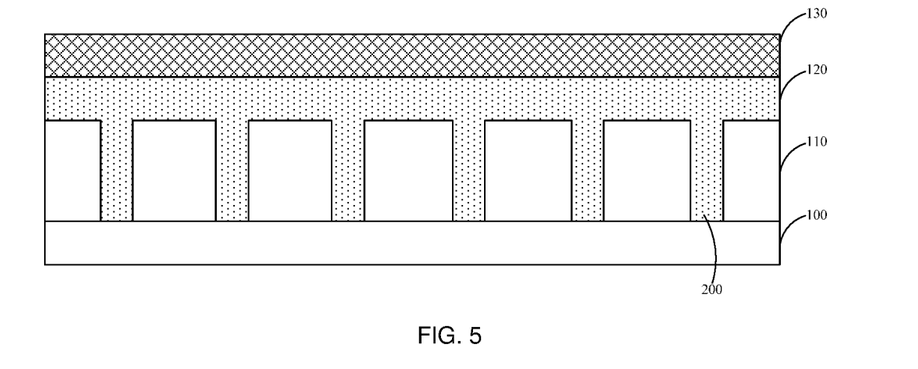

Referring to FIG. 5, a photolithography mask layer 130 is formed on a top surface of the bit line contact layer 120.

Figure 6:
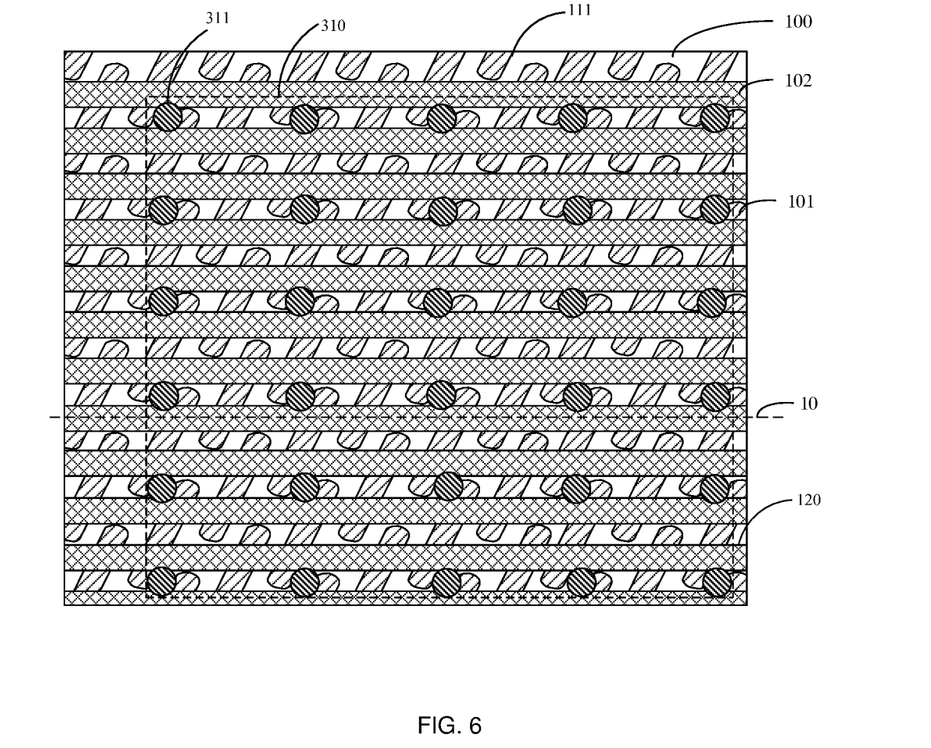
Figure 7:
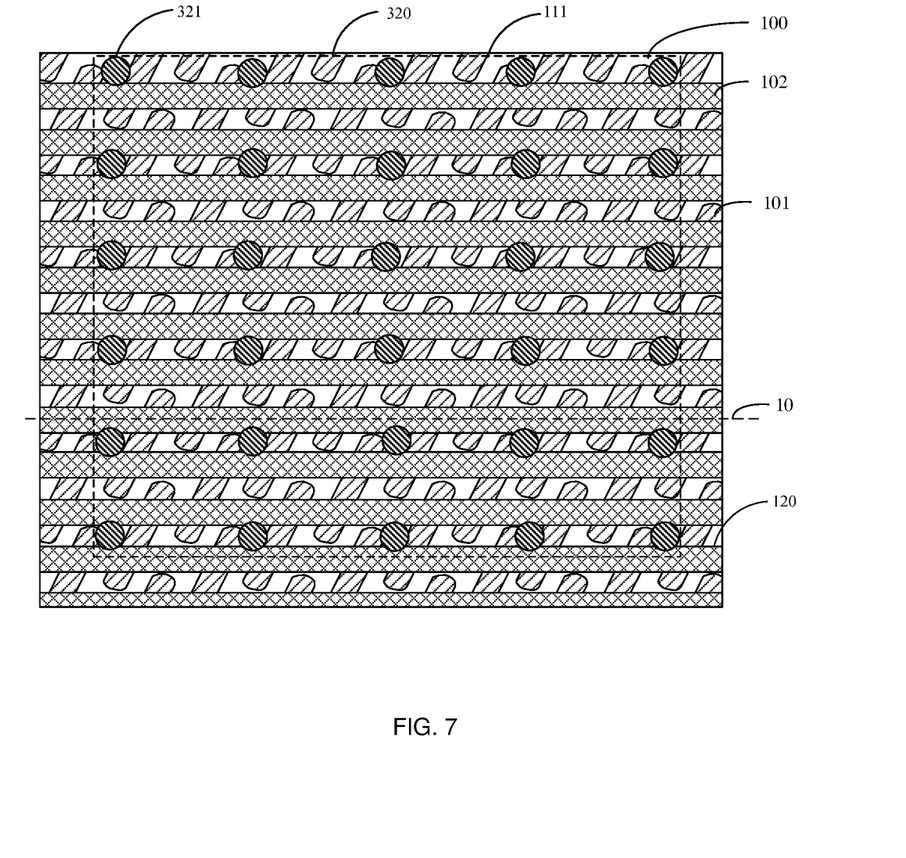
Figure 8:
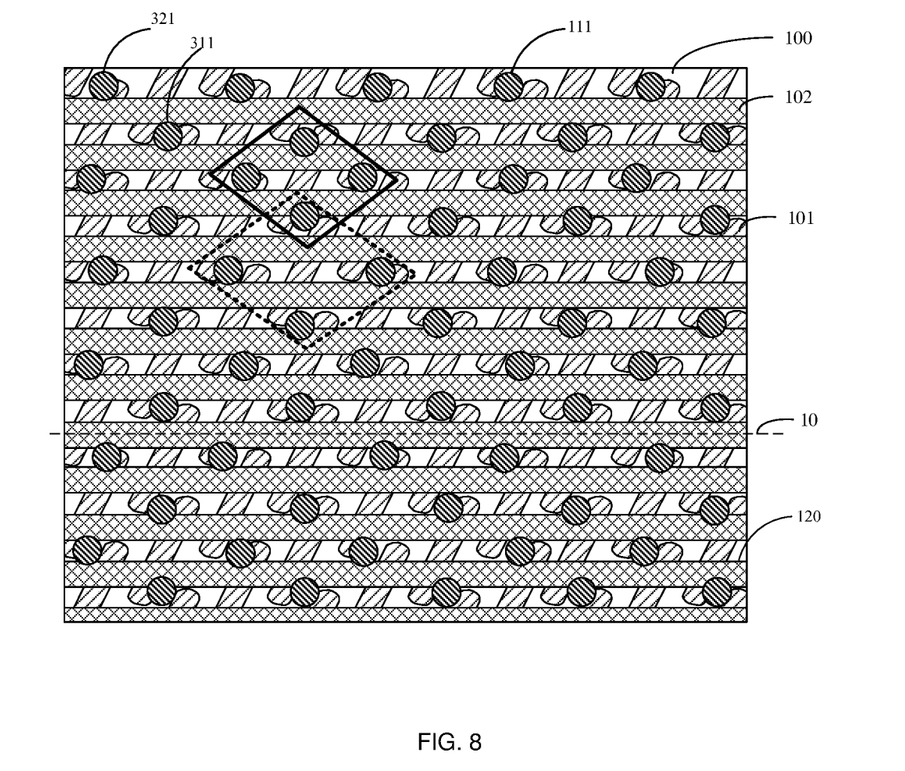

Referring to FIG. 6 to FIG. 8, the photolithography mask layer 130 is patterned twice to form a first mask pattern 310 and a second mask pattern 320. The first mask pattern 310 includes a plurality of first overlay patterns 311 arranged in rows and columns. The second mask pattern 320 includes a plurality of second overlay patterns 321 arranged in rows and columns. The first overlay patterns 311 and the second overlay patterns 321 are alternately arranged in sequence in the extension direction 10 of the word line structure and in a direction perpendicular to the word line structures. Parts of the bit line contact layer 120 are etched based on the first overlay patterns 311 and the second overlay patterns 321 arranged at intervals, to form the first bit line contact layers 121 at different heights. The first overlay patterns 311 and the second overlay patterns 321 arranged at intervals are removed.

After the photolithography mask layer 130 is formed on the top surface of the bit line contact layer 120, the photolithography mask layer 130 is patterned twice, form the first mask pattern 310 and the second mask pattern 320, and then parts of the bit line contact layer 120 are etched based on the first overlay patterns 311 and the second overlay patterns 321 arranged at intervals, to form the bit line contact layers 120 at different heights.

Referring to FIG. 8, after the photolithography mask layer 130 is formed on the top surface of the bit line contact layer 120, the photolithography mask layer 130 is patterned twice to form a first mask pattern subgroup shown in the figure and a second mask pattern subgroup shown in the figure. The first mask pattern subgroup is a region enclosed by a solid box, and the second mask pattern subgroup is a region enclosed by a dotted box.

The first mask pattern subgroup includes a first exposure pattern and a first overlay pattern 311, and the second mask pattern subgroup includes a second exposure pattern and a second overlay pattern 321. The first mask pattern subgroup and the second mask pattern subgroup share at least one first overlay pattern 311 or at least one second overlay pattern 321. In addition, the first exposure pattern and the second exposure pattern have different areas, and an area of the first exposure pattern may be smaller than that of the second exposure pattern. The first exposure pattern and the second exposure pattern are etched, and form bit line contact layers 120 at different heights.

Figure 9:
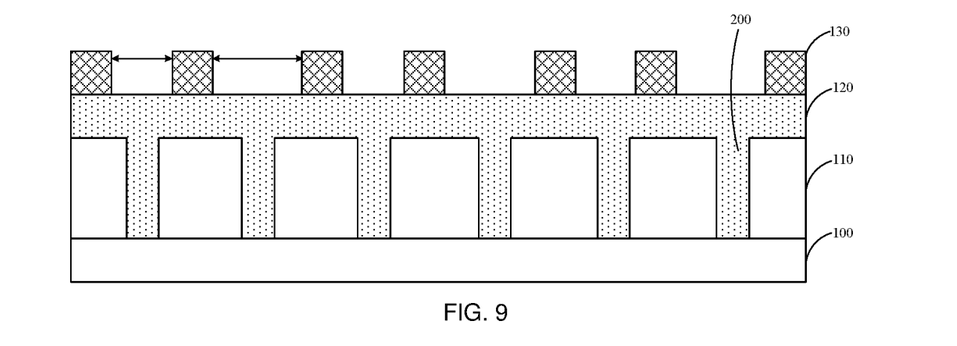
Figure 10:
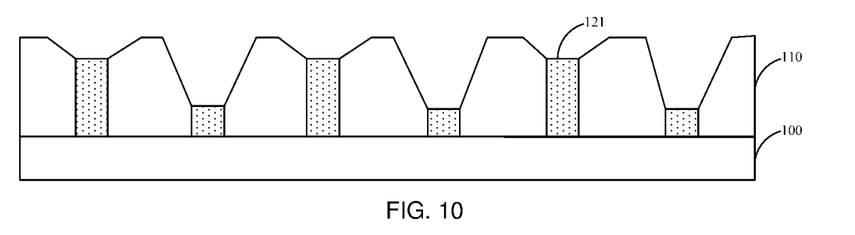

As shown in FIG. 8, FIG. 9, and FIG. 10, due to different spacings between the first overlay patterns 311 and the second overlay patterns 321 arranged at intervals in the direction perpendicular to the extension direction 10 of the word line structures, the bit line contact layer 120 between the first overlay pattern 311 and the second overlay pattern 321 are etched to form first bit line contact layers 121 at different heights and bottom dielectric layers 110 at different heights.

As shown in FIG. 6, FIG. 7, and FIG. 8, the first overlay patterns 311 and the second overlay patterns 321 arranged at intervals are circular or elliptical.

It should be noted that, FIG. 6, FIG. 7 and FIG. 8 exemplarily show that the first overlay patterns 311 and the second overlay patterns 321 arranged at intervals are circular, or the first overlay patterns 311 and the second overlay patterns 321 arranged at intervals may be elliptical, and the first overlay pattern 311 or the second overlay pattern 321 covers a part of the active area 101. A specific shape of each of the first overlay patterns 311 and the second overlay patterns 321 arranged at intervals is not limited in this embodiment of the present disclosure.

A reason for forming the bit line contact layers 121 at different heights includes that the conductive layers 140 are located at different heights after the first bit line contact layers 121 are configured to subsequently form the conductive layers 140.

Figure 12:
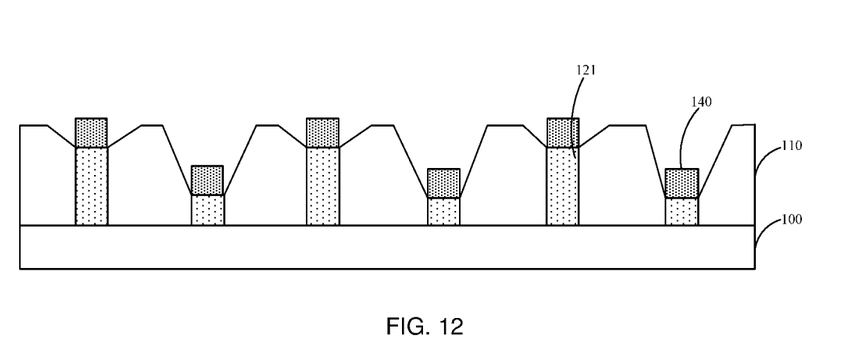

Referring to FIG. 12, the conductive layer 140 is formed on the top surface of each of the first bit line contact layers 121 at different heights.

Figure 11:
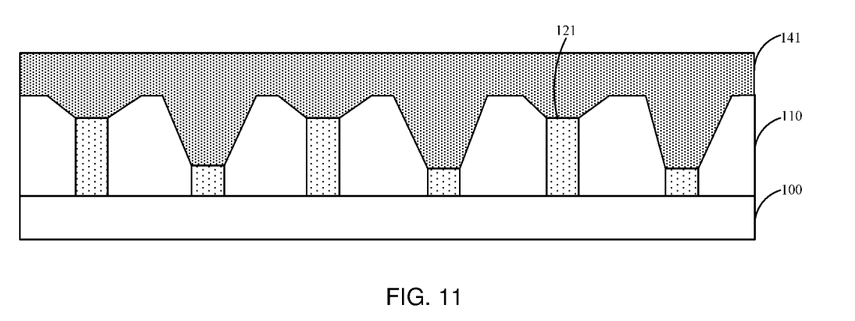

Referring to FIG. 11, a conductive film 141 is formed on the top surface of each of the first bit line contact layers 121 at different heights.

Referring to FIG. 12, the conductive film 141 (referring to FIG. 11) is etched, and forming conductive layer 140 has a uniform thickness on the top surfaces of the first bit line contact layer 121 at different heights.

The formation of the conductive layers 140 having the uniform thickness ensures that the conductive layers 140 located on the top surfaces of the first bit line contact layers 121 at different heights are located at different heights.

In other embodiments, the conductive layers located on the top surfaces of the first bit line contact layers at different heights may have different thicknesses, but it is required to ensure that top surfaces of the conductive layers are located at different heights, so that connection lines of conductive layers between different bit line structures are wavy lines. In this way, a spacing of the conductive layers between the bit line structures is increased without changing the arrangement of the bit line structures.

The top surfaces of the formed conductive layers 140 are located at different heights in a direction perpendicular to the extension direction 10 (referring to FIG. 8) of the word line structures, and the top surfaces are located at different heights in the extension direction 10 of the word line structures.

In this embodiment, the conductive layer 140 is formed by using one or more conductive materials, for example, doped polysilicon, titanium, titanium nitride, tungsten, and a complex of tungsten.

Figure 13:
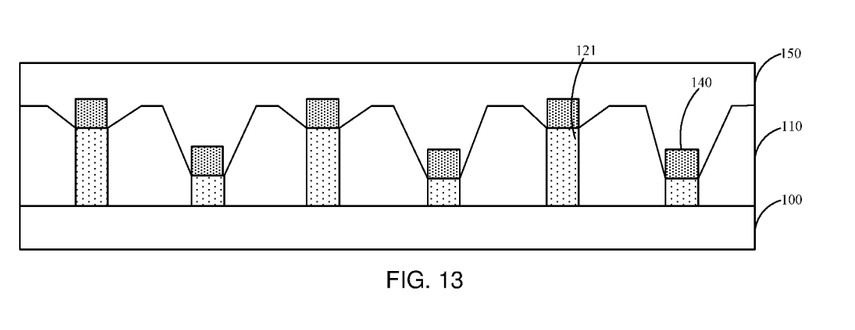

Referring to FIG. 13, a top dielectric layer 150 is formed on the top surface of the conductive layer 140.

A top dielectric film is formed on the top surface of the conductive layer 140. A surface of the top dielectric film is planarized to form the top dielectric layer 150. Top surface of the top dielectric layer 150 has a uniform height.

A top surface of the top dielectric film is planarized through chemical mechanical polishing. The chemical mechanical polishing process has a higher removal rate than the etching process, which is beneficial to shorten a process cycle.

In this embodiment, a material of the top dielectric layer 150 includes silicon nitride, silicon oxynitride, or silicon oxide. In this embodiment, the material of the top dielectric layer 150 is an insulation material containing nitrogen, that is, the top dielectric layer 150 is made of a silicon nitride material.

Figure 14:
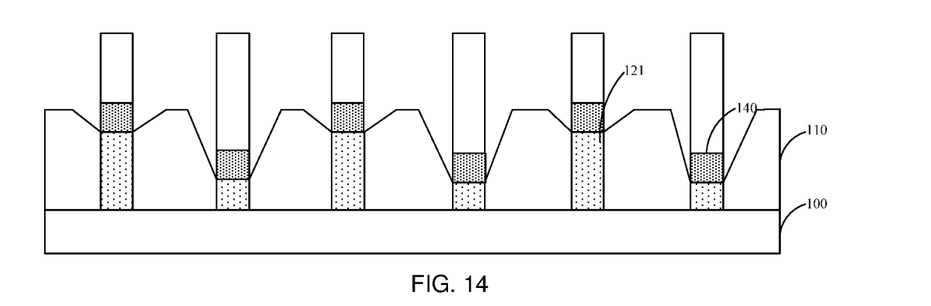
Figure 15:
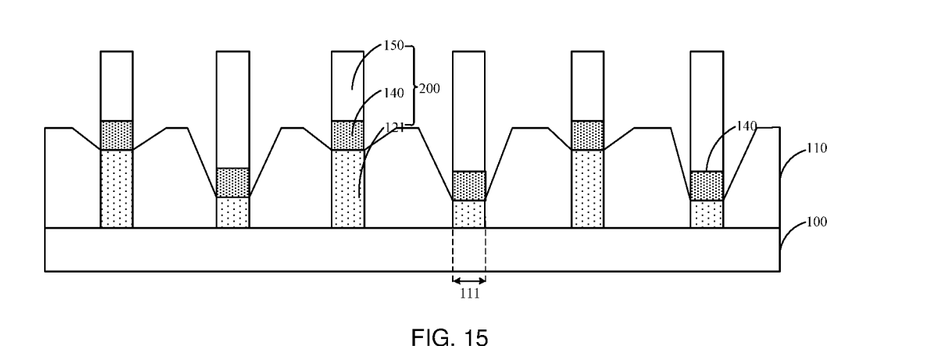
FIG. 15 is a schematic cross-sectional structural diagram of a memory formed according to an embodiment of the present disclosure.

Referring to FIG. 13, FIG. 14, FIG. 15, parts of the top dielectric layer 150, the conductive layer 140, and the first bit line contact layers 121 at different heights are etched in sequence, and forming discrete bit line structures 200.

Connection lines of the conductive layers 140 in the discrete bit line structures 200 are wavy lines in the direction perpendicular to the extension direction 10 (referring to FIG. 8) of the word line structures, and conductive layers 140 in adjacent discrete bit line structures 200 are located at different heights in the extension direction 10 of the word line structures.

According to the method of forming a memory provided in this embodiment of the present disclosure, the first exposure pattern and the second exposure pattern formed by using the first mask structure and the second mask structure in the mask structure have different areas. Therefore, the conductive layers in the bit line structures formed through etching are located at different heights, the top surfaces of the conductive layers are located at different heights in the direction perpendicular to the extension direction of the word line structures, and the top surfaces of the conductive layers are located at different heights in the extension direction of the word line structures, that is, in the subsequently formed discrete bit line structures, conductive layers in different bit line structures are located at different heights, and without changing the arrangement of bit line structures, conductive layers in adjacent discrete bit line structures are located at different heights, and compared with a distance between conductive layers at different heights, a distance between the conductive layers at a same height changes from a horizontal distance to an inclined distance. In this way, a spacing between the conductive layers in the bit line structures is increased, a parasitic capacitance between the bit line structures is reduced, and a saturation current of the memory is increased. In addition, the method of forming a memory provided in this embodiment has a simple procedure and low costs and is easy to implement.

Based on the foregoing embodiment, FIG. 15 is a schematic structural diagram of a memory according to an embodiment of the present disclosure. With reference to FIG. 3 and FIG. 15, the memory includes: a substrate 100, the substrate 100 includes at least a word line structure 102 and an active area 101; a bottom dielectric layer 110, the bottom dielectric layer 110 is located on top of the substrate 100, the bottom dielectric layer 110 has a bit line contact opening 111, and the bit line contact opening 111 exposes the active area 101 in the substrate 100; and discrete bit line structures 200, top surfaces of the bit line structures 200 are located at a same height, and the bit line structure 200 includes: first bit line contact layers 121 at different heights and located on top of the bottom dielectric layer 110 and in the bit line contact opening 111, conductive layers 140 located on top of the first bit line contact layers 121 at different heights, and a top dielectric layer 150 located on top of the conductive layer 140. Conductive layers 140 in a same bit line structure 200 are located at different heights in an extension direction 20 (referring to FIG. 3) of the bit line structure, and conductive layers 140 in adjacent bit line structures 200 are located at different heights in an extension direction 10 of the word line structures.

It should be noted that, the substrate 100 further includes another memory structure in addition to the word line structure 102 and the active area 101, for example, a shallow trench isolation structure. As a structure of the another memory does not involve a core technology of the present disclosure, details are not described herein. Those skilled in the art can understand that the substrate 100 further includes another memory structure in addition to the word line structure 102 and the active area 101, for normal operation of the memory.

In some embodiments of the present disclosure, the conductive layers 140 have a uniform thickness. In other embodiments, the conductive layers 140 located on top surfaces of the first bit line contact layers 121 at different heights may have different thicknesses, but it is required to ensure that top surfaces of the conductive layers 140 are located at different heights, so that connection lines of conductive layers 140 between different bit line structures 200 are wavy lines. In this way, a spacing of the conductive layers 140 between the bit line structures 200 is increased without changing the arrangement of the bit line structures 200.

In some embodiments of the present disclosure, connection lines of the conductive layers 140 are wavy lines in the extension direction 20 of the bit line structure, that is, conductive layers 140 in a same bit line structure 200 are located at different heights.

In some embodiments of the present disclosure, in the extension direction 10 of the word line structure, a conductive layer 140 at a first height and a conductive layer 140 at a second height are alternately arranged. In other embodiments, the conductive layers 140 may be alternately arranged in a preset height order.

The bit line contact layers at different heights are used, so that the conductive layers on the top surfaces of the bit line contact layers are located at different heights, the top surfaces of the conductive layers are located at different heights in a direction perpendicular to the extension direction of the word line structures, and the top surfaces of the conductive layers are located at different heights in the extension direction of the word line structures, that is, in subsequently formed discrete bit line structures, conductive layers in different bit line structures are located at different heights. Without changing the arrangement of the bit line structures, conductive layers in adjacent discrete bit line structures are located at different heights, and compared with a distance between conductive layers at different heights, a distance between the conductive layers at a same height changes from a horizontal distance to an inclined distance. In this way, a spacing between the conductive layers in the bit line structures is increased, a parasitic capacitance between the bit line structures is reduced, and a saturation current of the memory is increased. In addition, the method of forming a memory provided in the embodiments has a simple procedure and low costs and is easy to implement.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or feature may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the spirit and scope of the technical solutions of the embodiments of the present disclosure.

INDUSTRIAL APPLICABILITY

According to the method of forming a memory and the memory provided in the present disclosure, in the method of forming a memory, bit line contact layers at different heights are formed through mask patterns, so that conductive layers on top surfaces of the bit line contact layers are located at different heights, and top surfaces of the conductive layers are located at different heights in a direction perpendicular to an extension direction of a word line structures. Compared with a distance between conductive layers at different heights, a distance between the conductive layers at a same height changes from a horizontal distance to an inclined distance. In this way, a spacing between conductive layers in bit line structures is increased.

The invention claimed is:

1. A method of forming a memory, comprising:
providing a substrate, wherein the substrate comprises at least word line structures and active areas, and a bottom dielectric layer and a bit line contact layer located on a top surface of the substrate, the bottom dielectric layer has bit line contact openings, the bit line contact openings expose the active areas in the substrate, and the bit line contact layer covers the bottom dielectric layer and fills the bit line contact openings;
etching parts of the bit line contact layer, and forming a first bit line contact layer with different heights;
forming a conductive layer on a top surface of the first bit line contact layer, wherein a top surface of the conductive layer is located at different heights in a direction perpendicular to an extension direction of the word line structures; and the top surface of the conductive layer is located at different heights in the extension direction of the word line structures;
forming a top dielectric layer on the top surface of the conductive layer; and
etching parts of the top dielectric layer, the conductive layer, and the first bit line contact layer in sequence, and forming discrete bit line structures, wherein top surfaces of the discrete bit line structures are located at a same height, and each of the discrete bit line structures comprises: the first bit line contact layer located on a top of the bottom dielectric layer and in the bit line contact openings, the conductive layer located on the top of the first bit line contact layer, and the top dielectric layer located on the top of the conductive layer,
wherein the conductive layer in a same bit line structure of the discrete bit line structures is located at different heights in an extension direction of the discrete bit line structures, and the conductive layer in adjacent bit line structures of the discrete bit line structures is located at different heights in an extension direction of the word line structures.

2. The method of forming the memory according to claim 1, wherein the etching parts of the bit line contact layer, and forming the first bit line contact layer with different heights comprises:
forming a photolithography mask layer on a top surface of the bit line contact layer;
patterning the photolithography mask layer twice, and forming a first mask pattern and a second mask pattern, wherein the first mask pattern comprises a plurality of first overlay patterns arranged in rows and columns, the second mask pattern comprises a plurality of second overlay patterns arranged in rows and columns, and the first overlay patterns and the second overlay patterns are alternately arranged in sequence in the extension direction of the word line structures and in a direction perpendicular to the word line structures;
etching parts of the bit line contact layer based on the first overlay patterns and the second overlay patterns arranged at intervals, and forming the first bit line contact layer with different heights; and
removing the first overlay patterns and the second overlay patterns arranged at intervals.

3. The method of forming the memory according to claim 2, wherein the first overlay patterns and the second overlay patterns arranged at intervals are circular or elliptical.

4. The method of forming the memory according to claim 1, wherein after the etching parts of the top dielectric layer, the conductive layer, and the first bit line contact layer in sequence and forming the discrete bit line structures, connection lines of the conductive layer in the discrete bit line structures are wavy lines in the direction perpendicular to the extension direction of the word line structures, and the conductive layer in adjacent discrete bit line structures of the discrete bit line structures is located at different heights in the extension direction of the word line structures.

5. The method of forming the memory according to claim 1, wherein the forming the conductive layer on the top surface of the first bit line contact layer comprises:
forming a conductive film on the top surface of the first bit line contact layer; and
etching the conductive film, and forming the conductive layer having a uniform thickness on the top surface of the first bit line contact layer with different heights.

6. The method of forming the memory according to claim 1, wherein the forming the top dielectric layer on the top surface of the conductive layer comprises:
   forming a top dielectric film on the top surface of the conductive layer; and
   planarizing a top surface of the top dielectric film, and forming the top dielectric layer, a top surface of the top dielectric layer has a uniform height.

7. A memory, comprising:
   a substrate, wherein the substrate comprises at least word line structures and active areas;
   a bottom dielectric layer, wherein the bottom dielectric layer is located on a top of the substrate, the bottom dielectric layer has bit line contact openings, and the bit line contact openings expose the active areas in the substrate; and
   discrete bit line structures, wherein top surfaces of the discrete bit line structures are located at a same height, and each of the discrete bit line structures comprises: a first bit line contact layer located on a top of the bottom dielectric layer and in the bit line contact openings, a conductive layer located on a top of the first bit line contact layer, and a top dielectric layer located on a top of the conductive layer,
   wherein the conductive layer in a same bit line structure of the discrete bit line structures is located at different heights in an extension direction of the discrete bit line structures, and the conductive layer in adjacent bit line structures of the discrete bit line structures is located at different heights in an extension direction of the word line structures.

8. The memory according to claim 7, wherein the conductive layer in the discrete bit line structures has a uniform thickness.

9. The memory according to claim 7, wherein connection lines of the conductive layer are wavy lines in the extension direction of the discrete bit line structures.

10. The memory according to claim 7, wherein the conductive layer in the discrete bit line structures is alternately arranged in a preset height sequence in the extension direction of the word line structures.

* * * * *